US007002389B2

(12) United States Patent
Alvandpour et al.

(10) Patent No.: US 7,002,389 B2
(45) Date of Patent: Feb. 21, 2006

(54) FAST STATIC RECEIVER WITH INPUT TRANSITION DEPENDENT INVERSION THRESHOLD

(75) Inventors: Atila Alvandpour, Linkoping (SE); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 10/732,791

(22) Filed: Dec. 9, 2003

(65) Prior Publication Data

US 2005/0122158 A1   Jun. 9, 2005

(51) Int. Cl.
   *H03K 3/12*   (2006.01)
(52) U.S. Cl. ...................................... 327/205; 327/206
(58) Field of Classification Search ........ 327/108–112, 327/205, 206
   See application file for complete search history.

(56) References Cited

U.S. PATENT DOCUMENTS 5,594,361 A * 1/1997 Campbell .................... 326/24
6,124,733 A * 9/2000 Sharpe-Geisler ............. 326/83
6,388,487 B1 * 5/2002 Hirose ........................ 327/205
6,388,488 B1 * 5/2002 Ho ............................. 327/206
6,433,602 B1 * 8/2002 Lall et al. ................... 327/205

OTHER PUBLICATIONS

IIMA, Tomofumi et al., "Capacitance Coupling Immune, Transient Sensitive Accelerator for Resistive Interconnect Signals of Subquarter Micron ULSI", IEEE Journal of Solid-State Circuits, vol. 31, No. 4, pp. 531-536, Apr. 1996.

* cited by examiner

*Primary Examiner*—Kenneth B. Wells
(74) *Attorney, Agent, or Firm*—Jeffrey B. Huter

(57) ABSTRACT

A static receiver having a first inversion threshold for received signals undergoing a HIGH-to-LOW transition, and a second inversion threshold for received signals undergoing a LOW-to-HIGH transition, where the first inversion threshold is greater than the second inversion threshold. One embodiment comprises a static receiver, a pFET, and a nFET, where when a HIGH-to-LOW transition is being received at the receiver's input port, the pFET is coupled to the input port so as to contribute to raising the inversion threshold, and when a LOW-to-HIGH transition is being received at the input port, the nFET is coupled to the input port so as to contribute to lowering the inversion threshold. Other embodiments are described and claimed.

13 Claims, 10 Drawing Sheets

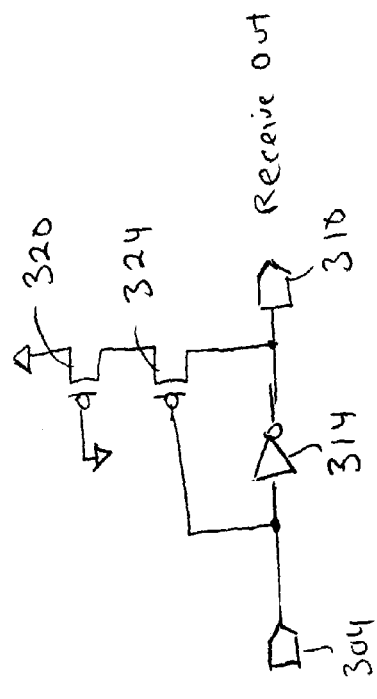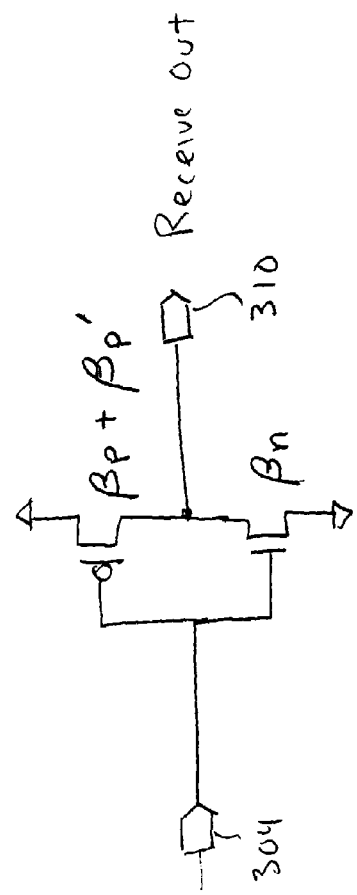
Fig. 4a
Fig. 4b

FAST STATIC RECEIVER WITH INPUT TRANSITION DEPENDENT INVERSION THRESHOLD

FIELD

The present invention relates to a digital circuit, and more particularly to a static receiver having a variable inversion threshold.

BACKGROUND

In computer systems, it is required to drive relatively large on-chip loads, such as for example, a long interconnect. On-chip interconnects, such as, for example, buses and bitlines, are found in virtually all components making up a computer system. Consider the computer system illustrated in FIG. 1. In FIG. 1, die 102 comprises a microprocessor with many sub-blocks, such as arithmetic logic unit (ALU) 104 and on-die cache 106. Die 102 may also communicate to other levels of cache, such as off-die cache 108. Higher memory hierarchy levels, such as system memory 110, are accessed via host bus 112 and chipset 114. In addition, other functional units not on die 102, such as graphics accelerator 116 and network interface controller (NIC) 118, to name just a few, may communicate with die 102 via appropriate buses or ports. Each of these functional units may physically reside on one die or more than one dice. Some or parts of more than one functional unit may reside on the same die. Each of these various described components requires driving large loads, such as long interconnects. As clock frequencies for the various chips and buses in a computer system increase, high-speed signaling by heavily loaded drivers presents challenges.

Full-swing, on-chip signal signaling schemes may generally be considered as either dynamic or static. A dynamic signaling scheme may be abstracted in FIG. 2a, where a dynamic driver comprising pFET (Field-Effect-Transistor) 202, nFET 204, and nFET 206 either charges or discharges interconnect 208 to HIGH ($V_{cc}$) or LOW ($V_{ss}$). Interconnect 208 may be a long interconnect or a large load, for example. A clock signal is provided to the gates of pFET 202 and nFET 206. Data is provided to the gate of nFET 204. During a pre-charge phase, the clock signal is LOW so that pFET 202 charges interconnect (load) 208 HIGH. During an evaluation phase, the clock signal is HIGH so that pFET 202 switches OFF, and interconnect 208 is conditionally discharged LOW depending upon the data signal provided to the gate of nFET 204.

Although dynamic signaling schemes are usually relatively fast, they may consume a considerable amount of power even when the data activity is zero (e.g., when the data signal is HIGH over a number of clock cycles). This is due to the power dissipated in clocking the pre-charge devices, as well as the unnecessary full-swing transitions on the interconnects.

In static schemes, drivers, repeaters, and receivers are typically simple CMOS static gates, such as inverters. A static scheme may be abstracted in FIG. 2b, where driver 210 and receiver 212 are static inverters. Interconnect 214 may be a large interconnect or large load, for example. Unlike a dynamic scheme, there is no significant power consumption for zero data activity. Furthermore, there is no clocked device that leads to clock power dissipation. However, in contrast to a dynamic scheme, both rising and falling signals received at the input of receiver 212 should be evaluated equally fast. Consequently, it has been desirable in static schemes that receivers should be symmetrical with an inversion threshold in the middle of the power rails. That is, denoting the HIGH and LOW power rail voltages as Vcc and Vss, respectively, the inversion threshold has historically been set at (Vcc−Vss)/2. But for signals with slow edge rates, there may be an undesirable delay before a signal reaches the inversion threshold for a symmetrical receiver. This may result in considerable delay and degrade the performance of a bus.

A fast, asymmetrical static receiver has been proposed in Tomofumi Iima, et al., "Capacitance Coupling Immune, Transient Sensitive Accelerator for Resistive Interconnect Signals of Subquarter Micron ULSI," IEEE Journal of Solid State Circuits, Vol. 31., no. 4, April 1996, pp 531–536, and is shown in FIG. 2c. However, there are some disadvantages to the circuit of FIG. 2c. This will be addressed after describing the proposed embodiments.

BRIEF DESCRIPTION OF THE DRAWINGS

FIGS. 4a and 4b illustrate effective circuits for the receiver of FIG. 3 as seen by a falling signal.

DESCRIPTION OF EMBODIMENTS

Figure 3:
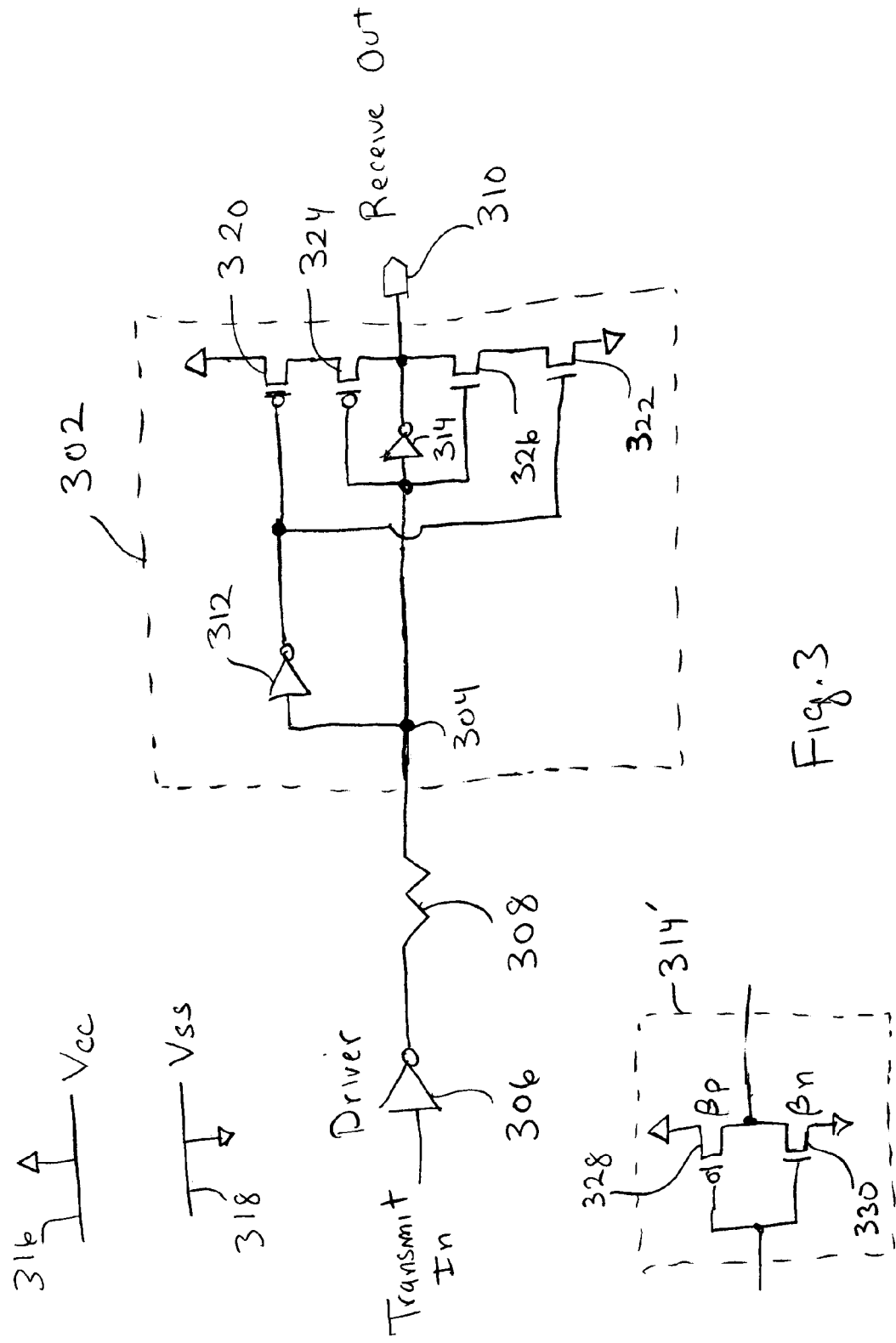
FIG. 3 is a receiver according to an embodiment of the present invention.

FIG. 3 illustrates a static receiver 302 according to an embodiment of the present invention. The input port of receiver 302 may be taken at node 304, which receives signals transmitted by static driver 306 over interconnect 308. The output port of receiver 302 is indicated by numeral 310. Static inverters 312 and 314 are symmetrical inverters, and may be realized by simple CMOS inverters. Whether or not a simple CMOS inverter is used to realize inverter 314, when describing the operation of receiver 302, it is convenient to consider inverter 314 as a simple CMOS inverter as shown within the dashed line labeled as 314' and to denote the device transconductance of pFET 328 as $\beta p$ and the device transconductance of nFET 330 as $\beta n$. For symmetrical operation, $\beta p$ and $\beta n$ should be substantially equal to each other. Also shown in FIG. 3 are power rails 316 and 318 with voltages Vcc (HIGH) and Vss (LOW), respectively. Although not shown in FIG. 3, some embodiments may employ a non-inverting delay element in-between the output port of inverter 312 and the gates of transistors 320 and 322.

Operation of receiver 302 is easily described as follows. Suppose a rising voltage has already been received at input port (node) 304 so that input port 304 is at Vcc. Inverter 312 provides voltage Vss to the gates of pFET 320 and nFET 322, so that pFET 320 is ON and nFET 322 is OFF. With nFET 322 OFF, nFET 326 is effectively isolated from power rail 318. With pFET 320 ON, a low impedance path is provided from the source of pFET 324 to power rail 316. Because a static scheme is employed, under normal operation node 304 will stay at Vcc until there is a change in the transmitted data, i.e., when a falling signal is received at input port 304. For purposes of considering now a falling signal received at input port 304, the effective circuit seen looking into input port 304 of receiver 302 may be taken as that shown in FIG. 4a.

Referring to FIG. 4a and to the representation 314' in FIG. 3 of inverter 314, the input signal at input port 304 effectively sees the simple CMOS inverter of FIG. 4b with an effective nFET device transconductance $\beta n$ and an effective pFET device transconductance $(\beta p+\beta p')$, where $\beta p'$ is the effective device transconductance of the series combination of pFETs 324 and 320. Because $\beta p$ and $\beta n$ are substantially equal to each other, it follows that $\beta n<(\beta p+\beta p')$. Consequently, the inversion threshold of receiver 302 is effectively raised so that receiver 302 is skewed in favor of the falling signal received at node 304. For a given size for inverter 314, the amount of skew is controlled by the size of pFETs 324 and 320. By sizing these pFETs appropriately, a significant skew may be realized.

Figure 5:
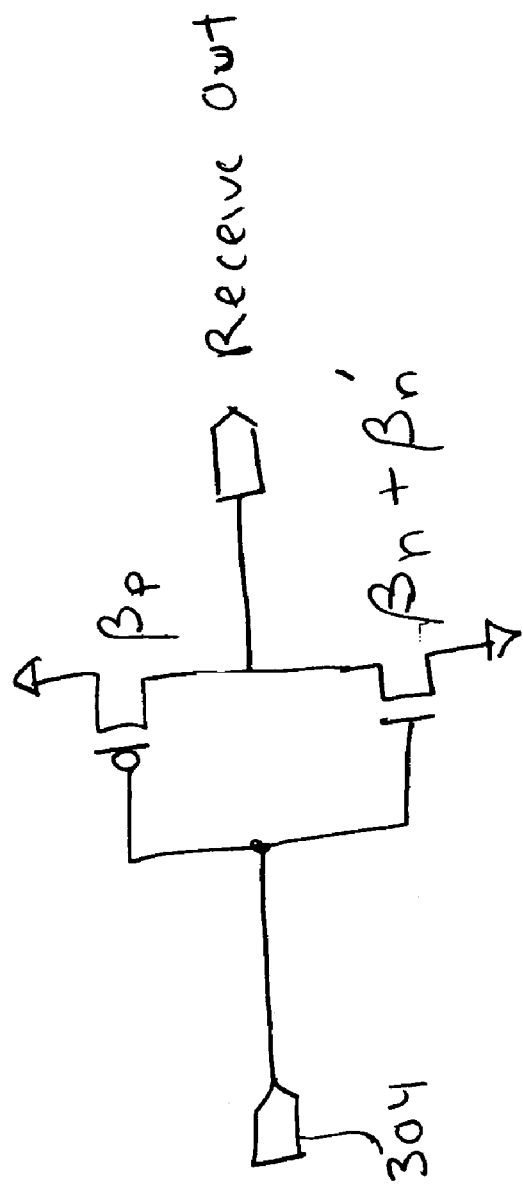
FIG. 5 illustrates an effective circuit for the receiver of FIG. 3 as seen by a rising signal.

Now consider another change in the transmitted data so that a rising signal is received at input port 304. Then, by a similar argument as described above, the input signal at input port 304 effectively sees the simple CMOS inverter of FIG. 5 with an effective nFET transconductance $(\beta n+\beta n')$, where $\beta n'$ is the effective nFET transconductance of the series combination of nFETs 326 and 322, and with an effective pFET transconductance of $\beta p$. It then follows that $\beta p<(\beta n+\beta n')$, so that now receiver 302 is skewed in favor of the rising signal received at node 304. By sizing nFETs 326 and 322 appropriately, a significant skew may be realized.

From the above discussion, it is observed that the ratio of effective pFET device transconductance to effective nFET device transconductance as seen by a received signal is made to depend upon a previously received signal when a data change occurs. As a result, a falling received signal sees a ratio $(\beta p+\beta p')/\beta n>1$, and a rising received signal sees a ratio $\beta p/(\beta n+\beta n')<1$. Consequently, receiver input-to-output transitions may be increased by appropriately sizing nFETs 322 and 326, and pFETs 320 and 324, with a resulting decrease in signal transmission delay.

Figure 6:
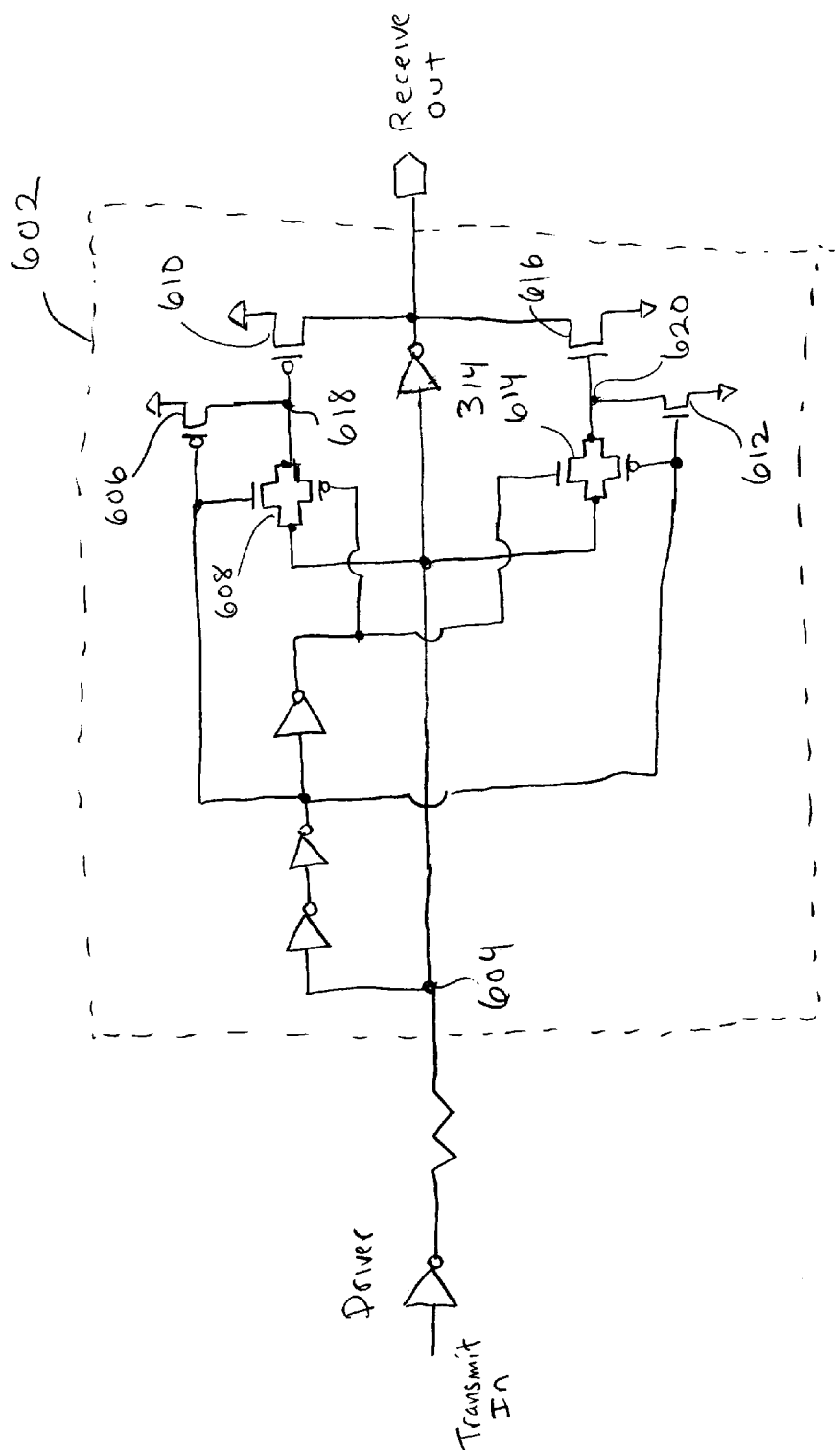
FIG. 6 is a receiver according to another embodiment of the present invention.

FIG. 6 illustrates a static receiver 602 according to another embodiment of the present invention. Suppose input port (node) 604 is already at Vcc. Then pFET 606 is OFF and transmission gate 608 is ON, so that there is a low impedance path coupling the gate of pFET 610 to input port 604. Also, nFET 612 is ON and transmission gate 614 is OFF, so that nFET 616 is held OFF and its gate is isolated from input port 604. The effective circuit looking into input port 604 is that of FIG. 4b, where now $\beta p'$ is the device transconductance of pFET 610. Like the receiver of FIG. 3, the receiver of FIG. 6 is skewed in favor of a falling signal received at input port 604. Similarly, if input node 604 is already at Vss, the effective circuit looking into input port 604 is that of FIG. 5, where now $\beta n'$ is the device transconductance of nFET 616, and the receiver of FIG. 6 is skewed in favor of a rising received signal at input port 604. Consequently, the receiver input-to-output transition of FIG. 6, like that of FIG. 3, may be increased by appropriately sizing nFET 616 and pFET 610, with a resulting decrease in signal transmission delay. However, the embodiment of FIG. 3 results in a simpler layout, with less routing and fewer transistors.

For both embodiments of FIGS. 3 and 6, as discussed earlier with respect to FIG. 3, the ratio of effective device transconductances as seen by a received signal is made to depend upon a previously received signal when a data change occurs. As a result, this variable nature of the ratio of effective device transconductances may introduce output glitches if the edge rate of the received signal is too slow. This may be mitigated by modifying the embodiments of FIGS. 3 and 6, as shown in FIGS. 7 and 8, respectively.

Figure 7:
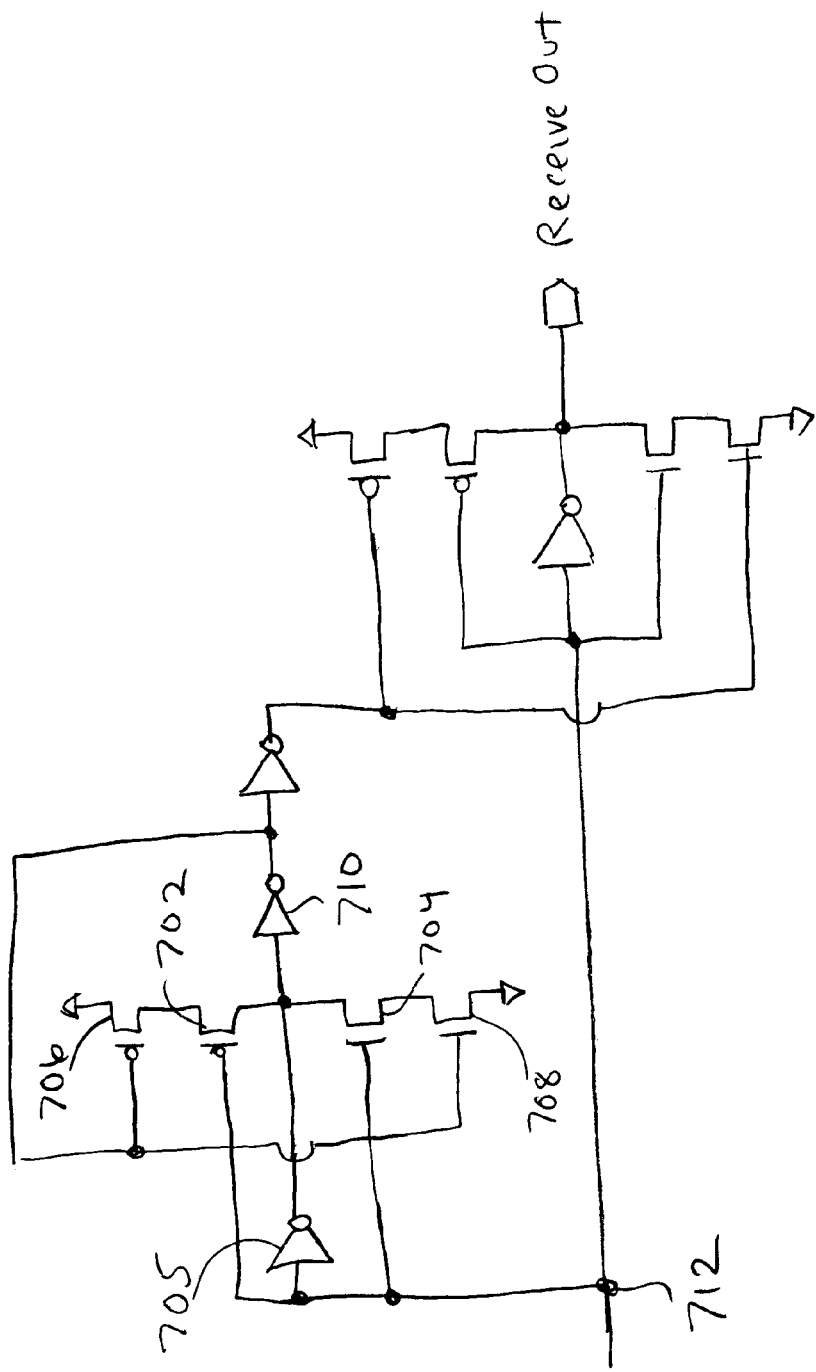
FIG. 7 is a modification to the receiver of FIG. 3 according to an embodiment of the present invention.

The operation of the receiver of FIG. 7 is not unlike that of FIG. 3. However, in FIG. 7, the combination of symmetrical inverter 705, transistors 702 and 704, and transistors 706 and 708 with their gates connected to the output port of inverter 710, results in an asymmetrical inverter with a raised inversion threshold for a rising signal at node 712 and a lowered inversion threshold for a falling signal at node 712. In contrast, inverter 312 of FIG. 3 is a symmetrical inverter with fixed inversion threshold. As a result, the variable inversion threshold for the asymmetrical inverter comprising symmetrical inverter 705, and transistors 702, 704, 706, and 708, may be designed to ensure that a received signal at input node 712 has made a sufficiently complete transition before the receiver of FIG. 7 is "reconfigured" in favor of the next input signal transition.

Figure 8:
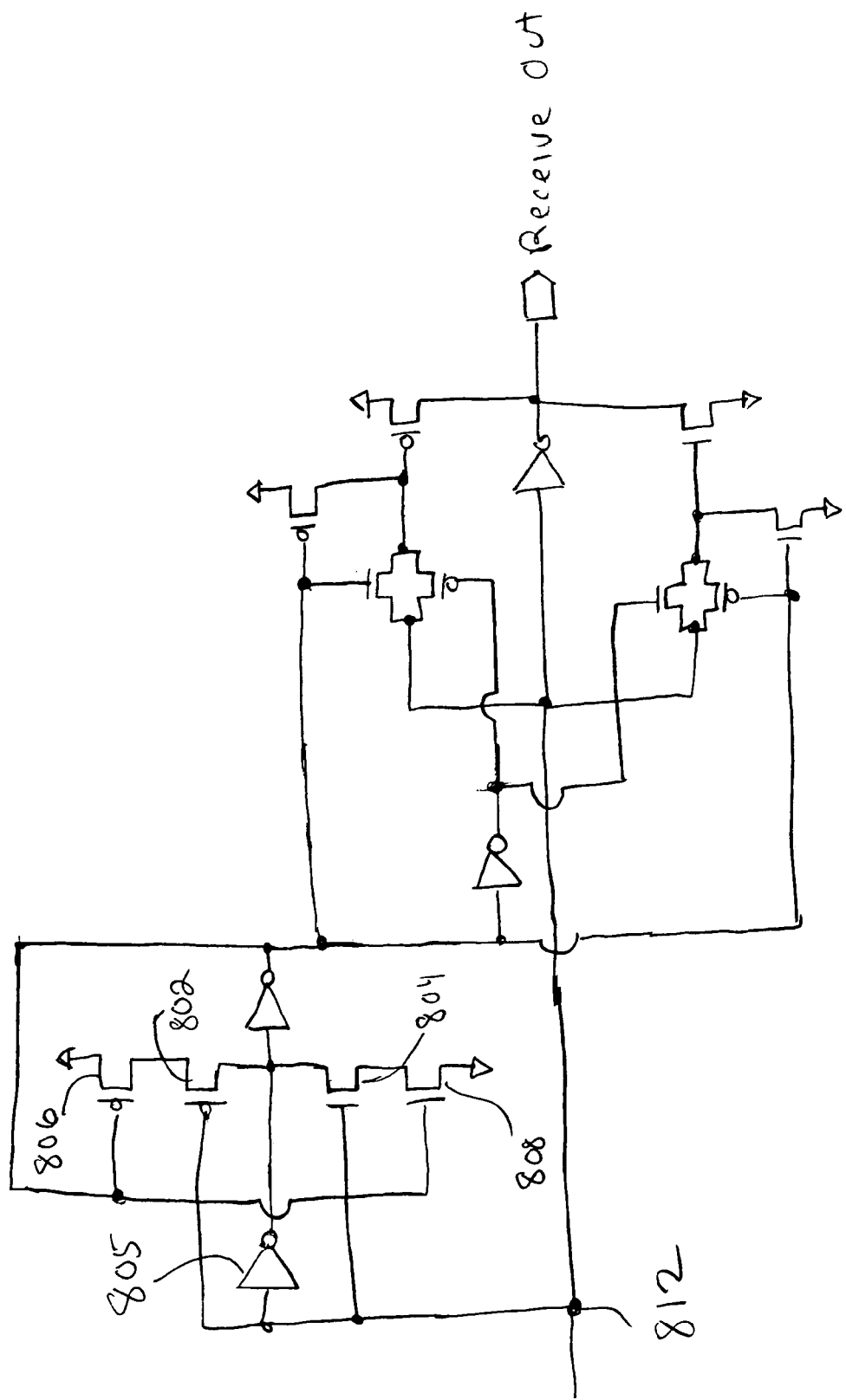
FIG. 8 is a modification to the receiver of FIG. 6 according to an embodiment of the present invention.

Similarly, the operation of the receiver of FIG. 8 is not unlike that of FIG. 6, except that resulting asymmetrical inverter comprising symmetrical inverter 805, and transistors 802, 804, 806, and 808, has a raised inversion threshold for a rising signal at node 812 and a lowered inversion threshold for a falling signal at node 812. As for the receiver of FIG. 7, this ensures that a received signal at input node 712 has made a sufficiently complete transition before the receiver of FIG. 8 is reconfigured in favor of the next input signal transition.

Figure 2A:
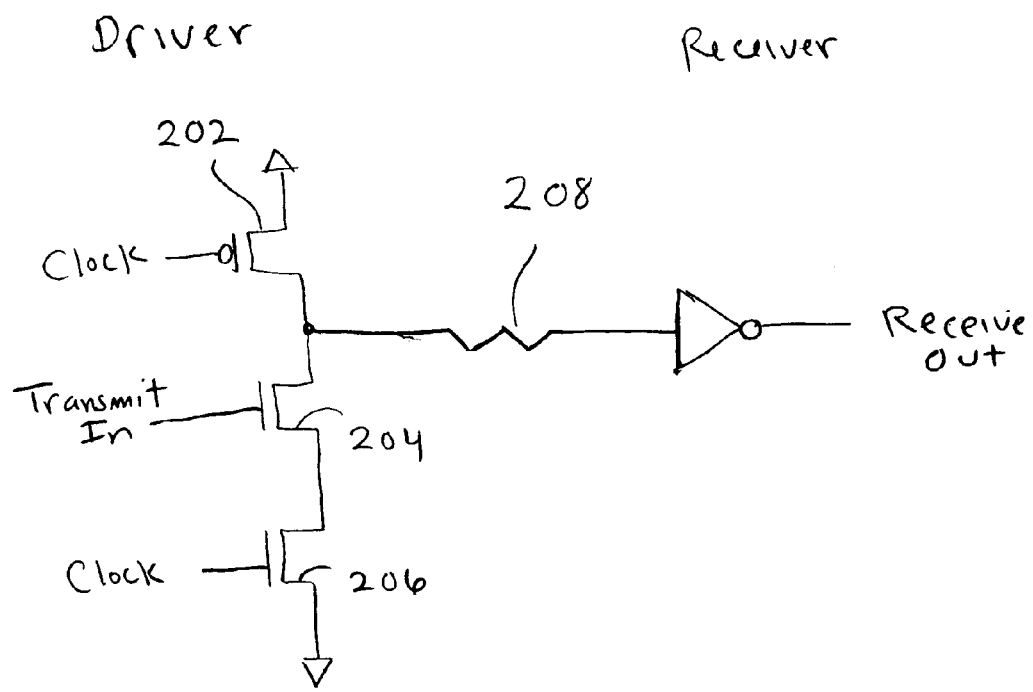
FIGS. 2a, 2b, and 2c illustrate prior art signaling schemes.
Figure 2B:
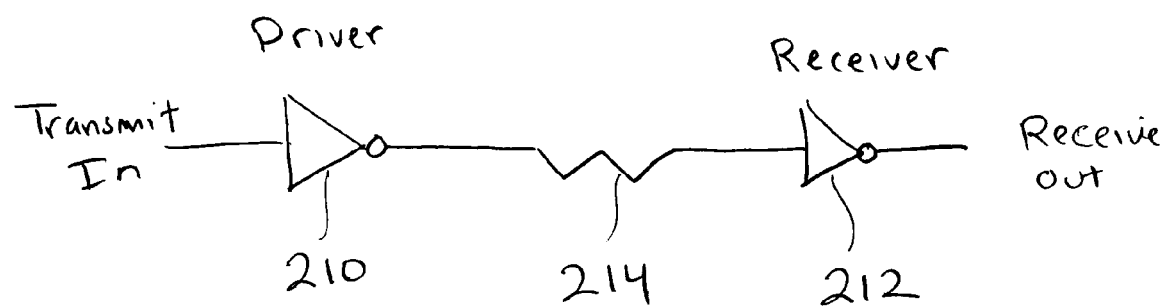
Figure 2C:
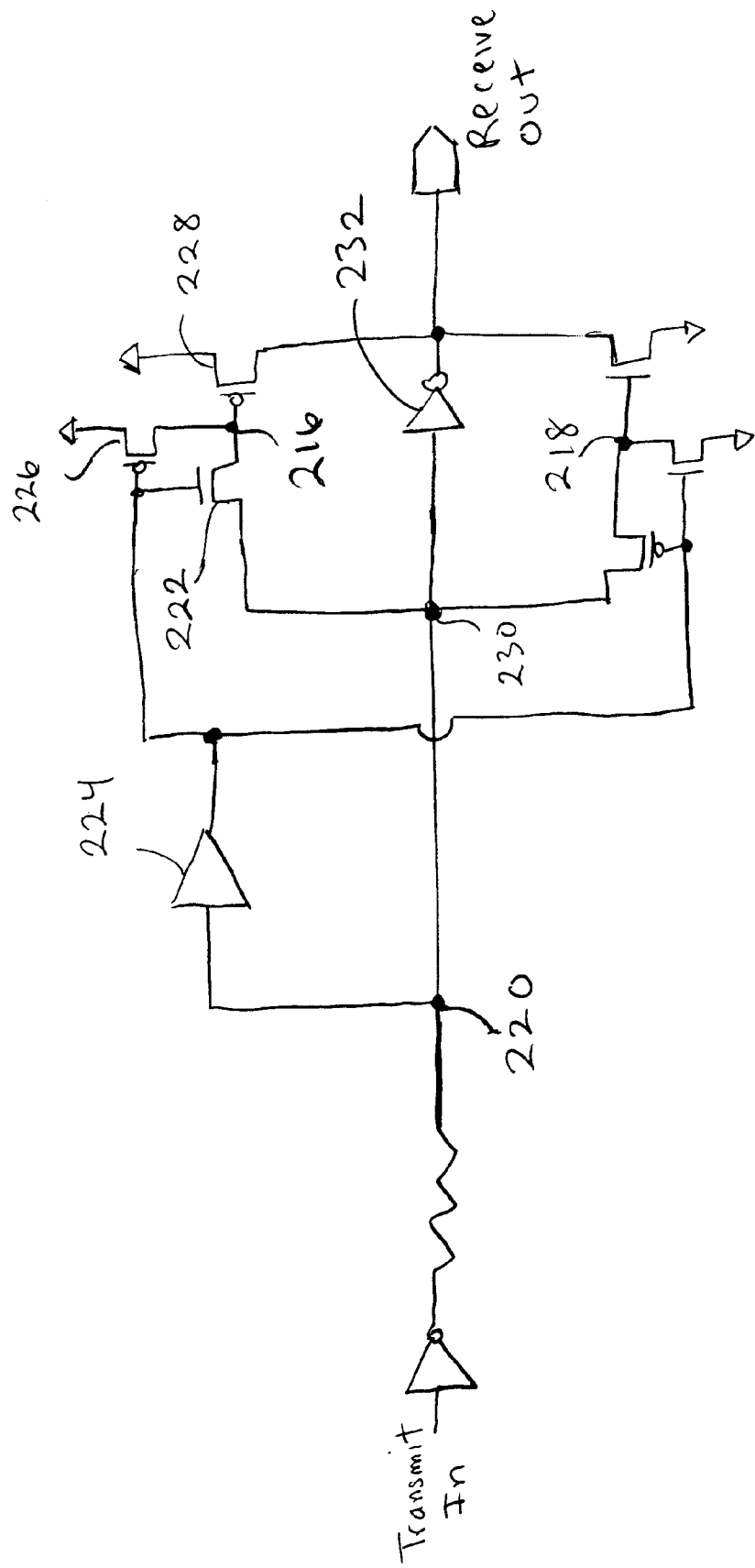

Referring now to FIG. 2c, its operation should be clear in light of the above description of the disclosed embodiments, where it is noted that element 224 in FIG. 2c is a non-inverting delay element. There are some disadvantages to the receiver of FIG. 2c when compared to the disclosed embodiments. The voltages at nodes 216 and 218 may be vulnerable to different sources of coupling noises. As one example, consider the case in which a HIGH signal is received at node 220, and where node 216 was previously charged to Vcc due to a previously received LOW signal at node 220. After a short time delay, when the received HIGH signal has had time to propagate via delay element 224, the gate terminal of nFET 222 makes a LOW to HIGH transition. This LOW to HIGH transition may couple into node 216 by way of the gate-to-channel capacitance of nFET 222, causing a voltage overshoot at node 216. Now, suppose in the next signaling time a LOW signal is received, so that node 220 now makes a HIGH to LOW transition. Before this newly received signal has had time to propagate through delay element 224 to set up the circuit in a new configuration, node 216 is supposed to be pulled LOW via nFET 222. But, the voltage overshoot on node 216 adds a delay to pulling down node 216, thereby possibly degrading performance. But perhaps more importantly, the voltage overshoot above Vcc at node 216 stresses the gate oxide of pFET 228, and may eventually damage pFET 228. A similar discussion applies to node 218. In contrast, the receiver of FIG. 6 (as well as FIG. 8) does not have this problem of developing voltage overshoots at nodes 618 and 620 because the voltage transitions on the two gate terminals of a transmission gate (e.g., transmission gates 608 or 614) are complementary to each other.

Figure 1:
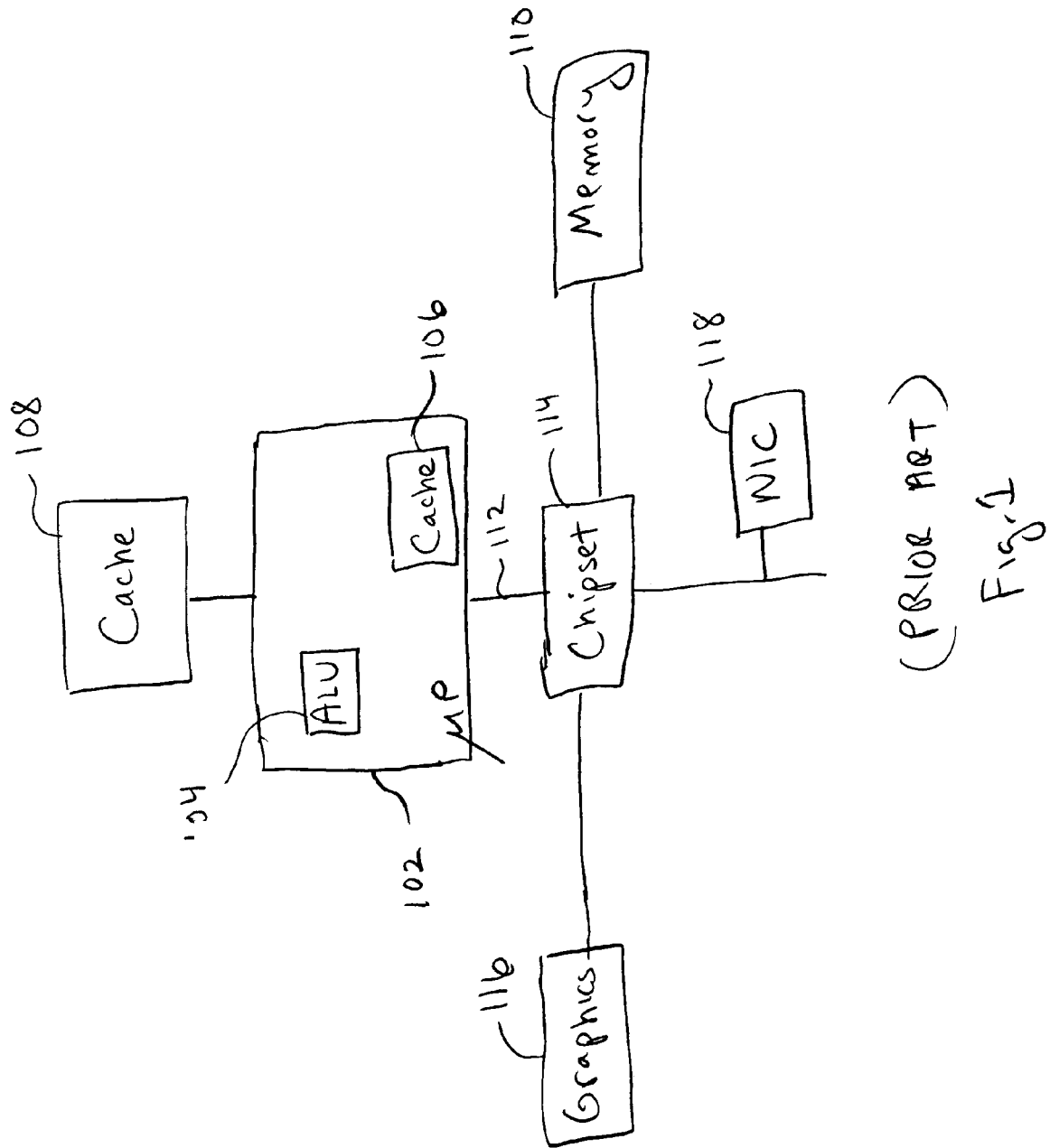
FIG. 1 illustrates a computer system.

As another example, it is noted that in VLSI chips, such as those used in the various components of the computer system illustrated in FIG. 1, there may be many independent signals propagating on neighboring interconnects on the same or neighboring interconnect layers within a VLSI chip. As a consequence, there is often a significant likelihood of noise coupling from one interconnect to another, and therefore robustness against such coupling noises is desirable. However, under some circumstances the receiver of FIG. 2c does not exhibit such robustness. For example, suppose node 216 has been charged to Vcc because a LOW signal was received at node 220. Suppose now that a HIGH signal is received at node 220, so that node 230 is now HIGH. After propagation of the received signal through delay element 224, pFET 226 is switched OFF and nFET 222 is switched ON. Until another signal transition is received, nFET 222 is supposed to keep node 216 at Vcc. But, nFET 222 cannot charge node 216 higher than Vcc-Vt, where Vt is the threshold voltage of nFET 222. Thus, if coupling noise were to drop the voltage at node 216 to Vcc-Vt, there is no mechanism to recover the voltage back to Vcc. Consequently, pFET 228 will start to conduct, causing considerable contention with pulldowns in inverter 232. This wastes power, and may result in degrading the speed performance. In contrast, the receiver of FIG. 6 (as well as FIG. 8) does not have this problem because the transmission gate keeps the node at Vcc. Note that the topology of FIG. 3 (as well as FIG. 7) is very different from that of FIG. 2c, and it does not suffer from the problems discussed above.

Various modifications may be made to the disclosed embodiments within the scope of the invention as claimed below. In the claims below, it is to be understood that the meaning of "A is connected to B" is that A and B are connected by a passive structure for making a direct electrical connection so that the voltage potential of A and B are substantially equal to each other. For example, A and B may be connected by way of an interconnect, transmission line, etc. In integrated circuit technology, the "interconnect" may be exceedingly short, comparable to the device dimension itself. For example, the gates of two transistors may be connected to each other by polysilicon or copper interconnect that is comparable to the gate length of the transistors.

It is also to be understood that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements. For example, A may be connected to a circuit element which in turn is connected to B.

What is claimed is:

1. A receiver comprising:
   a first inverter comprising an input port having an input voltage and an output port;
   a pFET comprising a gate and a drain connected to the output port;
   an nFET comprising a gate and a drain connected to the output port;
   a first transmission gate to couple the gate of the pFET to the input port; and
   a second transmission gate to couple the gate of the nFET to the input port;
   wherein the receiver has a first inversion threshold for the input voltage transitioning from HIGH to LOW, and a second inversion threshold for the input voltage transitioning from LOW to HIGH, where the first inversion threshold is greater than the second inversion threshold.

2. The receiver as set forth in claim 1, further comprising a second inverter to couple the first and second transmission gates to the input port.

3. The receiver as forth in claim 2, wherein the second inverter is a symmetrical inverter.

4. The receiver as set forth in claim 2, wherein the second inverter comprises an input port, wherein the second inverter has a first inversion threshold when there is a voltage at its input port transitioning from HIGH to LOW and has a second inversion threshold when the voltage at its input port is transitioning from LOW to HIGH, wherein the first inversion threshold is less than the second inversion threshold.

5. A receiver comprising:
   a first inverter comprising an input port having an input voltage and an output port;
   a pFET comprising a gate and a drain connected to the output port;
   an nFET comprising a gate and a drain connected to the output port;
   a first transmission gate;
   a second transmission gate; and
   wherein when the input voltage is transitioning from HIGH to LOW, the first transmission gate is ON to provide a low impedance path between the gate of the pFET and the input port, and the second transmission gate is OFF to provide a high impedance path between the gate of the nFET and the input port; and when the input voltage is transitioning from LOW to HIGH, the second transmission gate is ON to provide a low impedance path between the gate of the nFET and the input port, and the first transmission gate is OFF to provide a high impedance path between the gate of the pFET and the input port.

6. The receiver as set forth in claim 5, further comprising:
   a pullup pFET comprising a source connected to the gate of the pFET to keep the pFET OFF when the first transmission gate is OFF; and
   a pulldown nFET comprising a drain connected to the gate of the nFET to keep the nFET OFF when the second transmission gate is OFF.

7. The receiver as set forth in claim 6, further comprising:
   a second inverter to couple the first transmission gate, the second transmission gate, the pullup pFET, and the pulldown nFET to the input port.

8. The receiver as set forth in claim 7, wherein the second inverter is a symmetrical inverter.

9. The receiver as set forth in claim 7, wherein the second inverter comprises an input port, wherein the second inverter has a first inversion threshold when there is a voltage at its input port transitioning from HIGH to LOW and has a second inversion threshold when the voltage at its input port is transitioning from LOW to HIGH, wherein the first inversion threshold is less than the second inversion threshold.

10. The receiver as set forth in claim 5, further comprising:
    a second inverter to couple the first transmission gate and the second transmission gate to the input port.

11. The receiver as set forth in claim 10, wherein the second inverter is a symmetrical inverter.

12. The receiver as set forth in claim 10, wherein the second inverter comprises an input port, wherein the second inverter has a first inversion threshold when there is a voltage at its input port transitioning from HIGH to LOW and has a second inversion threshold when the voltage at its input port is transitioning from LOW to HIGH, wherein the first inversion threshold is less than the second inversion threshold.

13. A computer system comprising:
    memory;

a die in communication with the memory, the memory not residing on the die, the die comprising a receiver, the receiver comprising:
- a first inverter comprising an input port having an input voltage and an output port;
- a pFET comprising a gate and a drain connected to the output port;
- an nFET comprising a gate and a drain connected to the output port;
- a first transmission gate to couple the gate of the pFET to the input port; and
- a second transmission gate to couple the gate of the nFET to the input port;

wherein the receiver has a first inversion threshold for the input voltage transitioning from HIGH to LOW, and a second inversion threshold for the input voltage transitioning from LOW to HIGH, where the first inversion threshold is greater than the second inversion threshold.

* * * * *